United States Patent [19]

Wilkinson et al.

[11] Patent Number: 4,941,429
[45] Date of Patent: Jul. 17, 1990

[54] SEMICONDUCTOR WAFER CARRIER GUIDE TRACKS

[75] Inventor: Thomas F. Wilkinson, Kaoru Ishii both of Garland, Tex.

[73] Assignee: Texas Instruments Incorporated, Dallas, Tex.

[21] Appl. No.: 287,106

[22] Filed: Dec. 20, 1988

[51] Int. Cl.$^5$ ............................................. C23C 16/00
[52] U.S. Cl. .................................... 118/715; 118/500; 118/729; 118/733
[58] Field of Search ............... 118/500, 719, 729, 733, 118/715, 728; 414/217, 222; 156/345; 204/298

[56] References Cited

U.S. PATENT DOCUMENTS

| | | | |
|---|---|---|---|
| 3,598,082 | 8/1971 | Rice | 118/719 |
| 3,672,948 | 6/1972 | Foehring et al. | 118/719 |
| 3,765,763 | 10/1973 | Nygaard | 118/719 |
| 3,785,853 | 1/1974 | Kirkman et al. | 118/719 |
| 3,902,615 | 9/1975 | Levy et al. | 414/331 |
| 4,048,955 | 9/1977 | Anderson | 118/719 |
| 4,311,427 | 1/1982 | Coad et al. | 414/217 |
| 4,523,885 | 6/1985 | Bayne et al. | 432/259 |
| 4,597,708 | 7/1986 | Wheeler et al. | 414/331 |
| 4,697,974 | 10/1987 | Eltoukhy | 118/729 |
| 4,749,465 | 7/1988 | Flint et al. | 414/217 |
| 4,824,309 | 4/1989 | Kakehi et al. | 414/222 |

FOREIGN PATENT DOCUMENTS 63-84020  4/1988  Japan ................................. 118/729

Primary Examiner—Richard Bueker
Assistant Examiner—Terry J. Owens
Attorney, Agent, or Firm—Gary C. Honeycutt; Melvin Sharp; Rhys Merrett

[57] ABSTRACT

A track system is used in a continuous chemical deposition reaction system to guide semiconductor wafer carriers through a plurality of interconnected reaction chambers to position the carriers in each reaction chamber, and to prevent wear to the bottom of the reactor chambers.

17 Claims, 5 Drawing Sheets

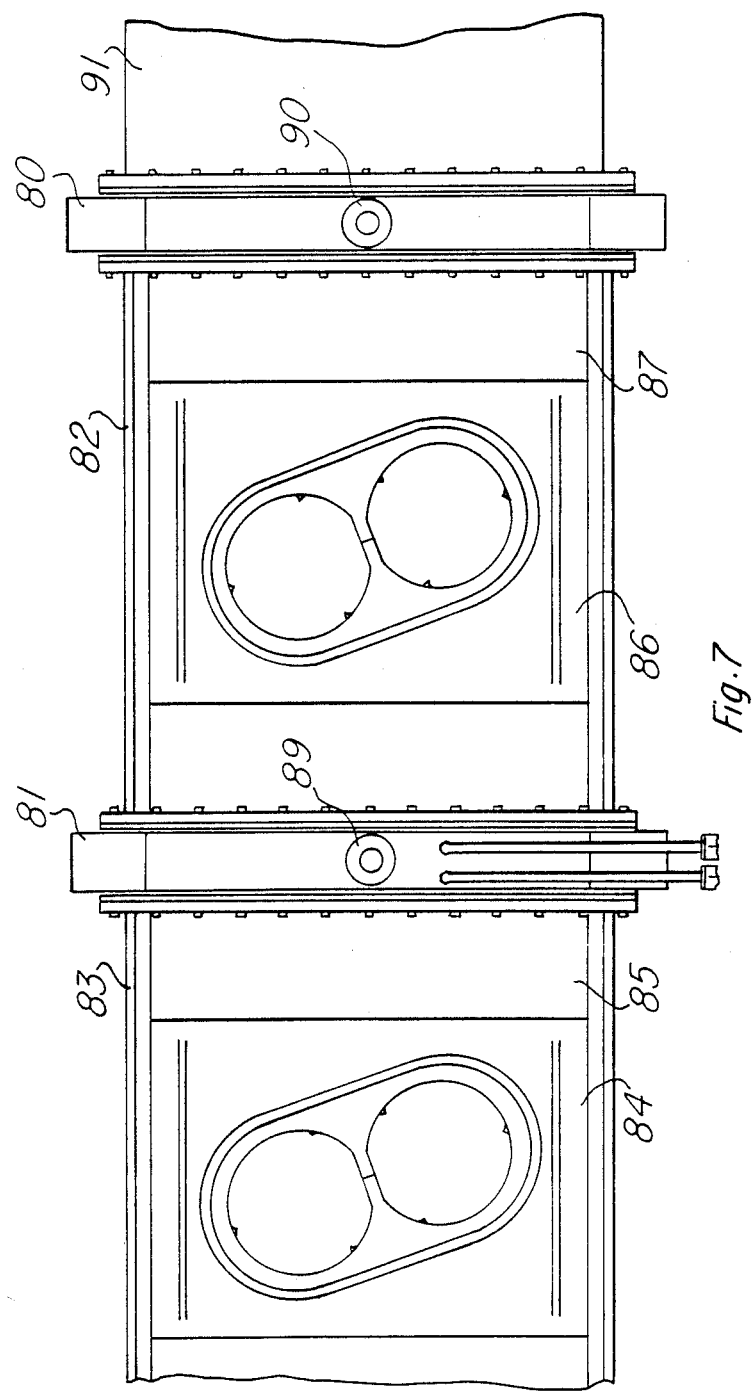

SEMICONDUCTOR WAFER CARRIER GUIDE TRACKS

FIELD OF THE INVENTION

This invention relates to continuous chemical vapor deposition reactors for processing semiconductor devices and more particularly to a semiconductor carrier guide track for use in such reactors.

BACKGROUND OF THE INVENTION

A continuous chemical deposition reactor may be a stand-alone process system with a continuous semiconductor slice flow. Basic subsystems in such a system may include a slice handling, a reaction chamber, a gas flow system, a cooling system, and an electrical system.

The slice handling system may include slice loaders and unloaders, slice carriers, and a track for moving a slice through the reactor chambers.

The reactor chamber subsystem is the site for processing the semiconductor slice. Each chamber may include a gas supply inlet, a chamber housing, heat lamps and exhaust.

The gas flow subsystem supplies the reactant gases to each chamber, and may include valves, flow controllers and an exhaust system.

The cooling subsystem assists in maintaining the process temperature and reduces the heat radiation to the surrounding components. Both air flow and water flow may be used in the cooling subsystem.

The electrical subsystem provides subsystem control and powers the reactor, and may include power supplies, motors, sensors, valves, and one or more computer/controller.

A basic reactor and process may be as follows. A semiconductor wafer is loaded onto a carrier which enters one end of the reactor through a port and is moved successively through the various chambers on the track system and out the other end of the reactor through another port. The reactor may not be physically closed, but has gas seals at each end and in between each chamber of the reactor. As an example, a reactor may include eight chambers in which the first chamber consists of a nitrogen seal, the second chamber is a preheat chamber, the next four chambers may be deposition chambers, then a cool-down chamber, and the last chamber is a nitrogen seal.

A typical gas supply system may supply gases for two different deposition processes which may be directed into any of the deposition chambers. Each chamber is effectively divided into two regions, a top region and a bottom region, by the substrate carriers and spacers between each wafer carrier. The junctions between the chambers effectively isolate one chamber from the other by the flow of gases, or the exhaust gases from the chambers.

SUMMARY OF THE INVENTION

The invention relates to a wafer carrier track on which the semiconductor wafer carrier is moved through the reactor to prevent undo wear on the reaction chamber. The track also is used as part of the divider to divided the reactor chamber into two regions, one region below the semiconductor carrier which is the process region and the top region, above the carrier which is the region through which heat is transmitted from a heating lamp to the carrier. The carrier or carrier lid is used in distributing heat evenly over the semiconductor wafer during processing.

A semiconductor wafer is removed from a wafer cassette by a robotic arm and is placed in a carrier. The carrier, constructed of graphite or graphite coated with silicon carbide may be one of several configurations, and may accommodate one or more semiconductor wafers depending upon the diameter of the wafer. The wafer is placed so that it is face down in the reactor such that all processing of the wafer is done from the underside of the carrier, and a lid, or the carrier itself is placed over the up-side of the semiconductor wafer to prevent process or other gases from reacting with that side, and to provide a uniform heat distribution to the semiconductor during processing.

Each chamber has an associated heat lamp, gas inlets and outlets, tracks on which the wafer carrier is moved. In one embodiment of the invention, round grooves on two sides of the carrier slide on round tracks. The seals prevent the gas from escaping to the environment outside the reactor, and prevent exhaust gases from entering the process chambers, or reaction gases from entering the topside of the reactor chamber. The carrier is also used to block the movement of process gas to the reactor chamber area above the carrier.

Each chamber of the reactor is divided into two regions by the wafer carrier. These two regions are regions above the carrier and below the carrier. The process gas flows through the lower part of the reactor below the carrier and across the exposed semiconductor wafer face.

An inert gas may be directed through the upper region of the reactor to prevent the process gases from entering the upper region and to help provide the gas pressure differential needed to prevent exhaust gases from entering the process region of the reactor.

The junction between chambers effectively isolates one chamber from the other by the flow of process gases or the exhaust of gas or gases from the chambers. The carrier track has openings through the track at each junction to permit the used process gases to exhaust through the exhaust port in the junction.

The technical advance represented by the invention as well as the objects thereof will become apparent from the following description of a preferred embodiment of the invention when considered in conjunction with the accompanying drawings, and the novel features set forth in the appended claims.

BRIEF DESCRIPTIONS OF THE DRAWINGS

FIG. 7 illustrates carriers in a reactor system separated by spacers.

DESCRIPTION OF A PREFERRED EMBODIMENT

Figure 1:
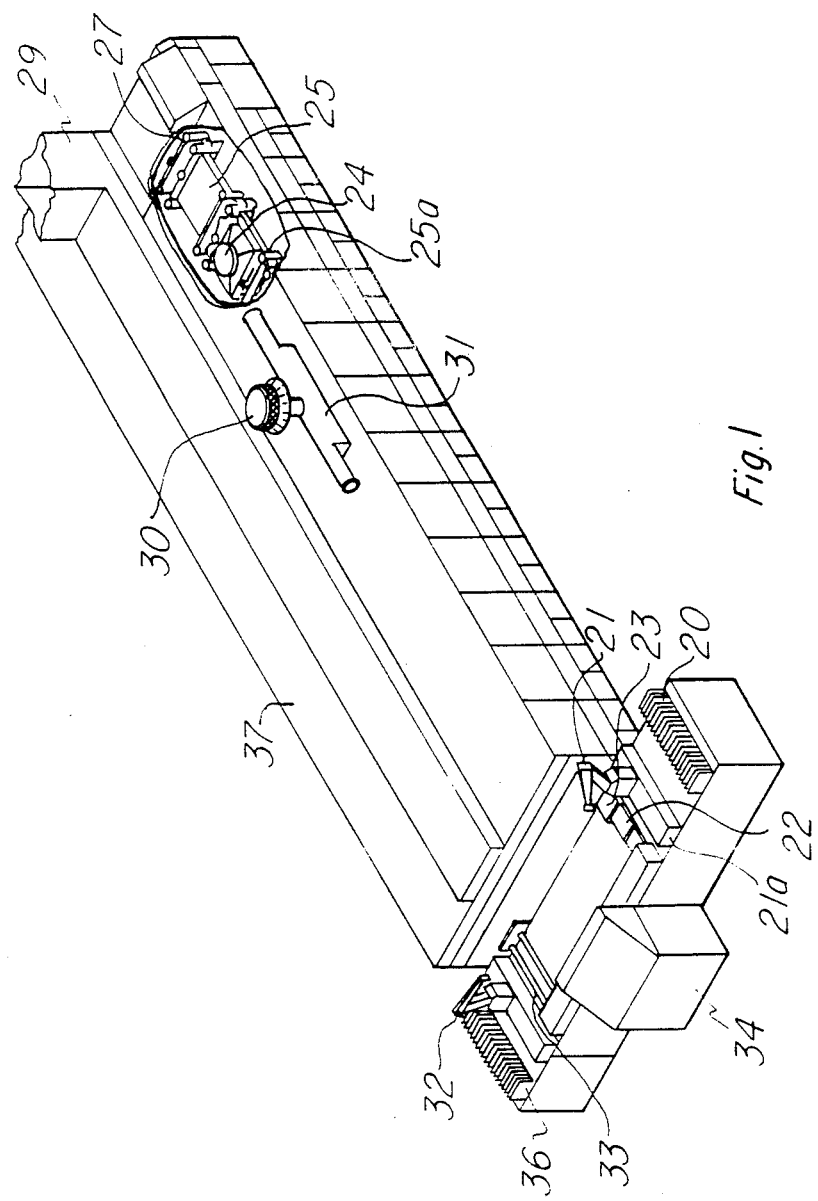
FIG. 1 illustrates a typical CCVD reactor in which the present invention may be used.

FIG. 1 illustrates a continuous chemical vapor deposition reactor in which the carrier track system of the present invention may be used. A plurality of wafer cassettes 20 are located along and adjacent to a robotic arm 21 which moves along a track 21a. The track allows the robotic arm 21 to move adjacent each of a plurality of wafer cassettes so as to permit the robotic arm to access each wafer in each cassette. The robotic arm lifts a wafer from a cassette and places it in a carrier 22 at the entrance to the reactor. The entrance 23 to the reactor is a seal joint to prevent gases in the reactor from exiting from the reactor.

At the entrance 23, and before the carrier enters the reactor, a vacuum pick-up arm (not illustrated) lifts the lid from the carrier to allow the robotic arm to place a semiconductor wafer into the carrier. After the semiconductor is placed into the carrier the carrier lid is replace and the carrier is indexed through the reactor and the plurality of chambers that make up the reactor.

The carrier is indexed through the reactor and chambers using the length of the carrier and at least one spacer bar between each carrier. As each carrier is indexed into the reactor, each preceding carrier is moved to the next reactor chamber. The indexing is continuous and as the carrier exits from the last reaction chamber it moves indexed through the return path of the reactor to the exit opening in the reactor, where the lid of the carrier is removed by the return lid pick-up (not illustrated). Tracks 33, which extend through out the reactor, are used to move the wafer carrier through the reactor. A robotic arm 32 mounded on track 32a removes the semiconductor wafer from the carrier and places it in a wafer cassette 36.

The reactor is divided into a plurality of quartz reactor chambers 25. The reaction chambers 25 are joined by a junction 25a through which is introduced the process gases and from which the used gases are exhausted.

Positioned over each reaction chamber is a heater block 24, used to heat the reaction chamber to a desired temperature. Water to cool the lamp housing is introduced through the junctions 25a though inlet 26.

Each junction 25a has at least one exhaust tube 27 for removing exhaust gases from the reaction chambers. The exhaust gases are directed through a burn-off tube 31 to the gas burner 30.

The entire reactor is shrouded in an enclosure 37, and an air duct 29 is provided to circulate and exhaust gas-/air from inside the system shroud.

Figure 2:
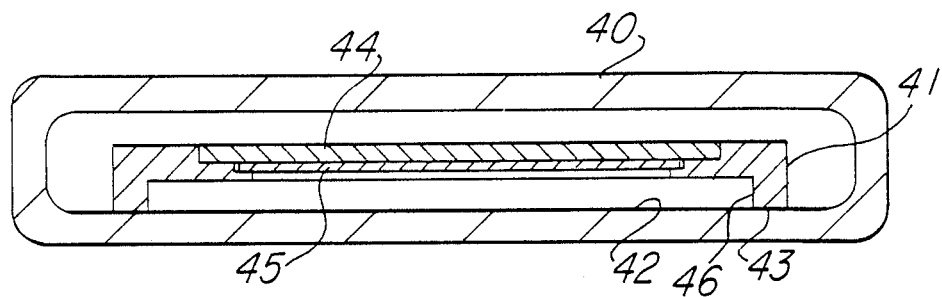
FIG. 2 illustrates a carrier of the prior art that moves along the bottom of the reaction chamber.

FIG. 2 illustrates a reactor chamber and semiconductor carrier of the prior art. Reactor chamber 40 has a semiconductor carrier 41 therein. The carrier has a lid 44 and carries a semiconductor wafer 45. The carrier is constructed to have legs 46 that slide along the bottom 42 of chamber 40 on the bottom 43 of legs 46. There is nothing to prevent the carrier 41 from moving laterally within the chamber, and with the buildup of deposition products on the bottom of the chamber, the movement of the carrier through the chamber may be impeded.

Figure 3:
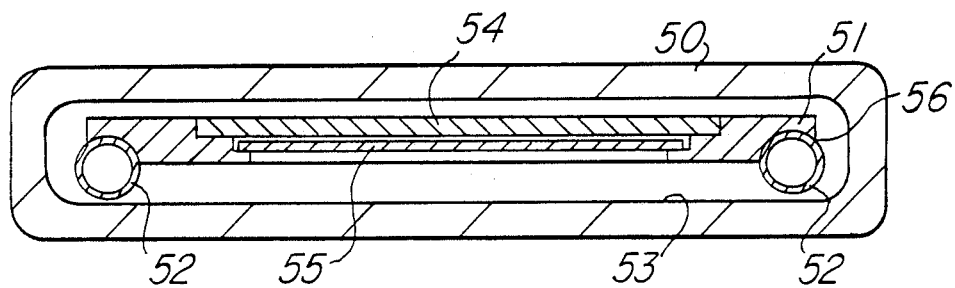
FIG. 3 is illustrates a track system according to the present invention.

FIG. 3 illustrates a carrier track system according to one embodiment of the present invention. Two tubular tracks 52 are positioned within reactor chamber 50. Carrier 51 has circular grooves 56 on each end of the carrier that ride on the circular tracks 52. With this system, the carrier moves smoothly down the tracks and cannot be moved laterally, only linearly down the tracks.

If there is a deposition product build up on the bottom 53 of the chamber 50, it does not affect the movement of the carrier. Carrier 51 has a lid 54 covering the semiconductor wafer 55. Tracks 52, which may be solid or may be tubes, as illustrated, block the process gases from leaving the under side of the carrier, confining the process gases to the area of the chamber under the carrier adjacent the exposed face of semiconductor wafer 55. The tubular tracks may be secured to the deposition chamber by any desired means such as, for example, an adhesive, fusing to the chamber at points adjacent the entrance of each chamber, or by bolts through holes in the tracks. Tracks 52 may be any high temperature material, but are preferable quartz, the same material as the chamber.

To better isolate the process area of the chamber from the other parts of the reaction chamber, tubular tracks 52 may have openings along the under side of the track, and process gas or other gases from the non-process part of the reactor chamber that enter the inside of the tracks are exhausted at openings in the tracks at the reaction chamber-junction interfaces as described below.

Figure 4:
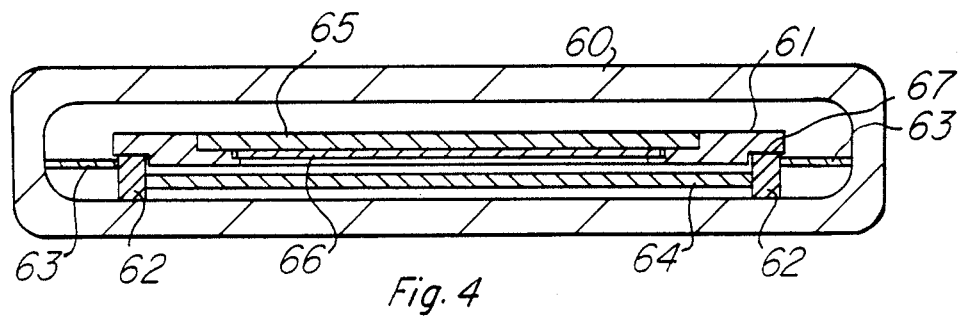
FIG. 4 illustrates a second embodiment of a track system of the present invention.

FIG. 4 is another embodiment of the invention. Reactor chamber 60 has a track therein made up of rectangular tracks 62, two side spacers 63 and a central brace 64. With this track system, the track does not have to be secured to the reaction chamber 60 as it will not move laterally to the chamber due to the spacers 63. The spacers 63 and central brace 64 do not extend the full length of the chamber but are placed only, for example, at the ends of the chamber. Carrier 61 slides along tracks 62 along offset 67. The offset in the carrier prevents the carrier from moving laterally to the tracks 62.

Figure 5:
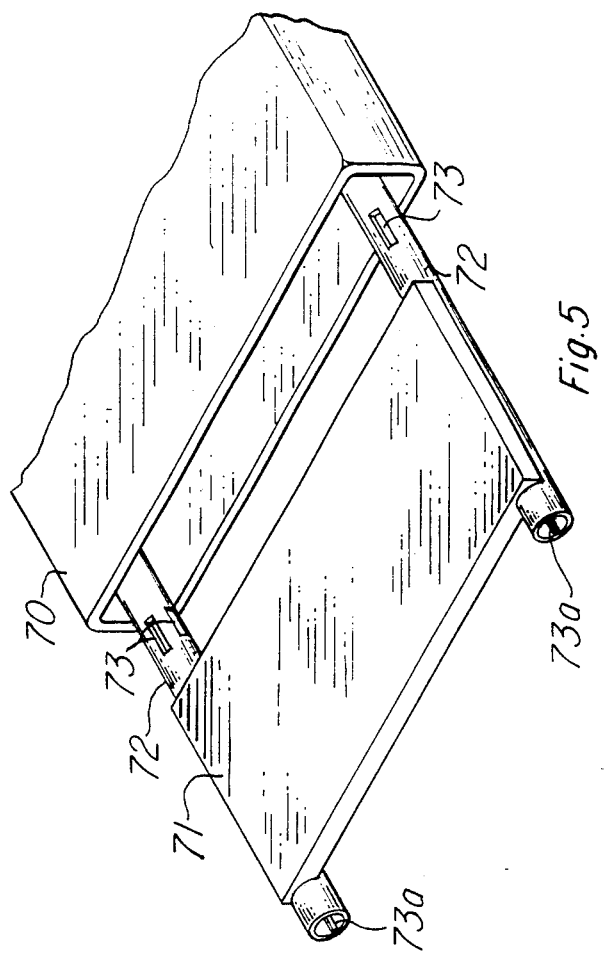
FIG. 5 is an isometric drawing illustrating a tubular track system.

FIG. 5 is an isometric view of tracks 72 and chamber 70, with carrier 71 on the tubular tracks. There are openings 73 and 73a in tracks 72. These openings are such that process gases may be exhausted from in between the tracks and under the carrier to the exhaust port in the junctions between reaction chambers. The openings 73a extend along the bottom of the tracks 72 and gases introduced through openings 73a are exhausted at openings 73 at the reaction chamber-junction interface.

In practice, there are spacers between each carrier so that there is a continuous movement of either spacers or semiconductor carriers on the track through the various chambers of the reactor (see FIG. 7).

Figure 6:
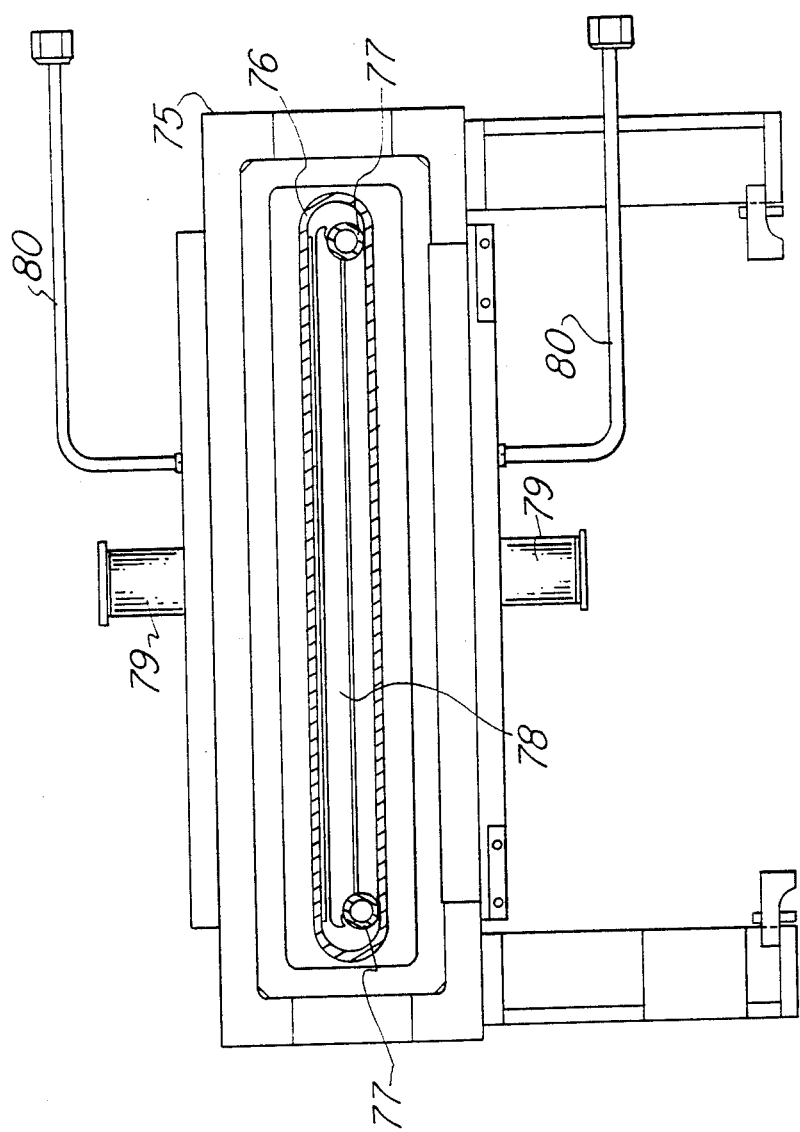
FIG. 6 is a cross-sectional view of a junction between reactor chambers and shows a carrier on a tubular track.

FIG. 6 illustrates a typical junction that joins the reaction chambers in the continuous chemical vapor reactor. Reactor 75 has inlets 80 to introduce process gases into the reaction chambers and exhaust ports 79 to exhaust the spent process gases. The ends of the reaction chambers 76 are connected to the chamber and form a gas seal therewith. The track 77 extends through the junction to provide a continuous track for carriers 78.

FIG. 7 illustrates two reaction chambers 82 and 83 connected together by a junction 81. Junction 81 is a process gas input junction as evidenced by gas inlets 88. Junction 81 also has an exhaust port 89, and another exhaust port on the under side (not illustrated, see FIG. 6).

Chamber 82 is connected to another chamber by junction 80. Junction 80 is an exhaust junction having an exhaust port 90. Junction 80 has no gas inlets. In practice, gas input junctions are alternated with exhaust only junctions.

In the portion of the reaction chamber illustrate in FIG. 7, it may be observed that each semiconductor carrier 84, 86 is spaced apart from the other carrier by a spacer 85,87. The spacers and carriers are constructed of a size such that as each carrier and adjacent spacer is started through the reactor, the semiconductor carriers are indexed such that the semiconductor wafer in the carrier is centered in each successive chamber until the semiconductor wafer has been indexed in each chamber of the reactor. The semiconductor wafer is then removed. as described in reference to FIG. 1. The track system described herein is useful in precisely indexing each semiconductor wafer through the reactor with no wear on the bottom of the reactor chambers, thus prolonging the life of each chamber. The track system may be temporarily removed from the chambers so that the chambers may be cleaned.

What is claimed is:

1. A semiconductor carrier and track system for transporting semiconductor wafers through a reactor system comprising the combination of:
    a plurality of interconnected reaction chambers;
    a semiconductor wafer carrier having grooves along two sides of the carrier; and
    a pair of guide tracks extending through said reaction chambers, spaced to accept said grooves along two sides of said semiconductor wafer carrier;
    wherein, said guide tracks are removably mounted in said reaction chambers and said semiconductor wafer carrier is movable through said reaction chambers along said guide tracks.

2. The combination according to claim 1, including a central brace between the guide tracks.

3. The combination according to claim 1, including a pair of spacers, one each attached to the guide tracks to position the guide tracks in said reaction chambers.

4. The combination according to claim 1, wherein said guide tracks are tubular and the grooves along said semiconductor wafer two sides of the carrier are circular to match the surface of the guide tracks.

5. The combination according to claim 1, wherein said guide tracks are rectangular, and the carrier has offset areas on each side to slide along the rectangular tracks.

6. The combination according to claim 1, wherein said guide tracks are made of quartz.

7. The combination according to claim 1, wherein a process gas is directed into a region under said semiconductor wafer carrier, and said semiconductor wafer carrier and said guide tracks confine the process gas to said region.

8. A semiconductor carrier and track system for transporting semiconductor wafers through a reactor system, comprising the combination of:
    two or more quartz reaction chambers joined by junctions;
    a semiconductor wafer carrier having grooves along two sides of the carrier; and
    a pair of quartz guide tracks spaced to accept the grooves along two sides of said semiconductor wafer carrier;
    wherein said guide tracks are removably mounted in said two or more reaction chambers and said semiconductor wafer carrier is movable through said two or more reaction chambers along said guide tracks.

9. The combination according to claim 8, including a pair of spacers, one each attached to the guide tracks to position the guide tracks in the reaction chambers.

10. The combination according to claim 8, wherein a process gas is directed into a region under the semiconductor wafer carrier, and
    said semiconductor wafer carrier and said guide tracks confine said process gas to said region.

11. The combination according to claim 8, wherein said reaction chambers are joined at gas inlet junctions and exhaust junctions, and the gases entering the guide tracks are exhausted at the junctions.

12. A semiconductor carrier and track system for transporting semiconductor wafers through a reactor system, comprising the combination of:
    one or more reaction chambers;
    a semiconductor wafer carrier having grooves along two sides of the carrier; and
    a pair of guide tracks spaced to accept the grooves along two sides of said semiconductor wafer carrier;
    wherein said guide tracks are removably mounted in said one or more reaction chambers and said semiconductor wafer carrier is are movable through said one or more reaction chambers along said guide tracks; and
    wherein said guide tracks have openings therein at spaced intervals for exhausting the process gas entering the tracks from under the semiconductor wafer carrier and from the part of said one or more reaction chambers not under the semiconductor wafer carrier.

13. The combination according to claim 12 wherein said reaction chambers are joined at gas inlet junctions and exhaust junctions, and the guide track openings are located at the junctions.

14. A semiconductor carrier and track system for transporting semiconductor wafers through a reactor system, comprising the combination of:
    two or more quartz reaction chambers joined by junctions;
    a semiconductor wafer carrier having grooves along two sides of the carrier;
    a pair of quartz guide tracks spaced to accept the grooves along two sides of said semiconductor wafer carrier;
    wherein said guide tracks are removably mounted in said two or more reaction chambers and said semiconductor carrier is movable through said two or more reaction chambers along said guide tracks; and a central brace between the guide tracks.

15. A semiconductor carrier and track system for transporting semiconductor wafers through a reactor system, comprising the combination of:
    two or more quartz reaction chambers joined by junctions;
    a semiconductor wafer carrier having grooves along two sides of the carrier; and
    a pair of quartz guide tracks spaced to accept the grooves along two sides of said semiconductor wafer carrier;
    wherein said guide tracks are removable mounted in said two or more reaction chambers and said semiconductor wafer carrier is movable through said two or more reaction chambers along said guide tracks; and
    wherein said guide tracks are tubular and the grooves along the two sides of said semiconductor wafer carrier are circular to match the surfaces of the guide tracks.

16. A semiconductor carrier and track system for transporting semiconductor wafers through a reactor system, comprising the combination of:
- two or more quartz reaction chambers joined by junctions;
- a semiconductor wafer carrier having grooves along two sides of the carrier; and
- a pair of quartz guide tracks spaced to accept the grooves along two sides of said semiconductor wafer carrier;
- wherein said guide tracks are removably mounted in said two or more reaction chambers and said semiconductor wafer carrier is movable through said two or more reaction chambers along said guide tracks; and
- wherein said guide tracks are rectangular, and the semiconductor wafer carrier has offset areas on each side to slide along the rectangular tracks.

17. A semiconductor carrier and track system for transporting semiconductor wafers through a reactor system, comprising the combination of:
- two or more quartz reaction chambers joined by junctions;
- a semiconductor wafer carrier having grooves along two sides of the carrier; and
- a pair of quartz guide tracks spaced to accept the grooves along two sides of said semiconductor wafer carrier;
- wherein said guide tracks are removably mounted in said two or more reaction chambers and said semiconductor wafer carrier is are movable through said two or more reaction chambers along said guide tracks;
- wherein the guide tracks have openings therein at spaced intervals for exhausting the process gas from under the semiconductor wafer carrier and from the parts of the reaction chambers not under the semiconductor wafer carrier; and
- wherein the reaction chambers are joined at gas inlet junctions and exhaust junctions, and the gases entering the guide tracks are exhausted at the junctions.

* * * * *